United States Patent
Bammer et al.

(10) Patent No.: US 7,902,825 B2
(45) Date of Patent: Mar. 8, 2011

(54) MOTION CORRECTED TENSOR MAGNETIC RESONANCE IMAGING

(75) Inventors: Roland Bammer, Palo Alto, CA (US); Murat Aksoy, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 173 days.

(21) Appl. No.: 12/454,530

(22) Filed: May 18, 2009

(65) Prior Publication Data
US 2009/0284257 A1 Nov. 19, 2009

Related U.S. Application Data

(60) Provisional application No. 61/128,199, filed on May 19, 2008.

(51) Int. Cl.
*G01V 3/00* (2006.01)
(52) U.S. Cl. ......................................... 324/309; 324/307
(58) Field of Classification Search ................... 324/309, 324/307
See application file for complete search history.

(56) References Cited

U.S. PATENT DOCUMENTS

| | | | |
|---|---|---|---|
| 5,539,310 A | 7/1996 | Basser | |
| 6,326,786 B1 | 12/2001 | Pruessmann | |
| 6,614,226 B2 * | 9/2003 | Wedeen | 324/309 |
| 6,853,191 B1 | 2/2005 | Miller | |
| 6,969,991 B2 | 11/2005 | Bammer | |
| 6,992,484 B2 * | 1/2006 | Frank | 324/307 |
| 7,348,776 B1 | 3/2008 | Aksoy | |
| 7,408,345 B2 | 8/2008 | Bammer | |
| 7,834,627 B2 * | 11/2010 | Sakai et al. | 324/318 |
| 7,860,291 B2 * | 12/2010 | Hwang | 382/131 |

OTHER PUBLICATIONS

Pipe, "Motion Correction with Propeller MRI: Application to Head Motion and Free-Breathing Cardiac Imaging", Magnetic Resonance in Medicine, 1999, pp. 963-969, v42.
Rhode et al., "Comprehensive Approach for Correction of Motion and Distortion in Diffusion-Weighted MRI", Magnetic Resonance in Medicine, 2004, pp. 103-114, v51.
Bammer et al., "Augmented Generalized SENSE Reconstruction to Correct for Rigid Body Motion", Magnetic Resonance in Medicine, 2007, pp. 90-102, v57.

* cited by examiner

*Primary Examiner* — Louis M Arana
(74) *Attorney, Agent, or Firm* — Lumen Patent Firm

(57) ABSTRACT

In tensor MRI, a set of k-space MRI data points is acquired that includes one or more k-space subsets of MRI data points. An object orientation (or spatial transformation) corresponding to each of the k-space subsets is determined. Because the object orientation (or spatial transformation) can differ from subset to subset, the overall set of k-space data can be inconsistent with respect to object orientation (or spatial transformation). This possible inconsistency can be addressed by providing a k-space tensor model that includes object orientation and/or spatial transformation information corresponding to each of the subsets. A tensor MRI image can be reconstructed from the set of k-space MRI data points by using the k-space tensor model to account for object orientation and/or spatial transformation.

16 Claims, 6 Drawing Sheets

|  |  | Method A<br>No Correction<br>(Gridding) | | | Method B<br>Phase Correction<br>(CG SENSE) | | | Method C<br>Phase & Motion Correction<br>(CG SENSE) | | | Method D<br>Phase & Motion & Diff. Enc.<br>Dir. Correction (NLCG) | | |
|---|---|---|---|---|---|---|---|---|---|---|---|---|---|
|  |  | FA | Mean Diffusivity | Angular Deviation | FA | Mean Diffusivity | Angular Deviation | FA | Mean Diffusivity | Angular Deviation | FA | Mean Diffusivity | Angular Deviation |
| EPI | No Motion | 0.88 | 371.0 | 0.06 | 0.88 | 370.9 | 0.06 | 0.88 | 370.9 | 0.07 | 0.88 | 372.8 | 0.07 |
| EPI | Small Motion | 0.96 | 478.8 | 50.13 | 0.92 | 415.9 | 20.23 | 0.86 | 370.2 | 2.82 | 0.88 | 374.4 | 0.22 |
| EPI | Moderate Motion | 0.97 | 453.5 | 51.75 | 0.99 | 461.4 | 34.46 | 0.84 | 365.7 | 8.48 | 0.89 | 370.0 | 0.26 |
| SPIRAL | No Motion | 0.88 | 371.0 | 0.07 | 0.88 | 370.9 | 0.06 | 0.88 | 370.9 | 0.07 | 0.88 | 372.8 | 0.07 |
| SPIRAL | Small Motion | 1.07 | 341.0 | 49.35 | 0.92 | 393.4 | 13.07 | 0.86 | 370.9 | 2.10 | 0.88 | 373.9 | 0.18 |
| SPIRAL | Moderate Motion | 1.02 | 402.3 | 43.11 | 0.90 | 377.4 | 21.32 | 0.82 | 367.7 | 7.09 | 0.88 | 373.1 | 0.19 |

Fig. 5

| | Motion | FA_REF | meandif (ref) | Method A No Correction (Gridding) | | | Method B Phase Correction (CG SENSE) | | | Method C Phase & Motion Correction (CG SENSE) | | | Method D Phase & Motion & Diff. Enc. Dir. Correction (NLCG) | | |
|---|---|---|---|---|---|---|---|---|---|---|---|---|---|---|---|
| | | | | FA | MD | AD | FA | MD | AD | FA | MD | AD | FA | MD | AD |
| Splenium of CC | Negligible | 0.68 | 748.0 | 0.67 | 941.4 | 19.28 | 0.68 | 760.1 | 1.18 | 0.68 | 747.9 | 0.0 (Ref) | 0.69 | 750 | 1.47 |
| | Small | 0.67 | 813.8 | 0.37 | 1279.3 | 25.6 | 0.66 | 903.6 | 9.56 | 0.67 | 836.0 | 5.16 | 0.69 | 814.2 | 4.43 |
| | Moderate | 0.68 | 748.0 | 0.32 | 1030.6 | 34.25 | 0.48 | 753.5 | 14.64 | 0.57 | 735.9 | 7.83 | 0.64 | 730.2 | 5.22 |
| | Large | 0.68 | 748.0 | 0.32 | 1228.5 | 67.09 | 0.49 | 592.4 | 32.59 | 0.32 | 688.6 | 20.26 | 0.48 | 698.3 | 17.73 |
| Genu of CC | Negligible | 0.51 | 817.0 | 0.51 | 1118.8 | 46.97 | 0.47 | 805.0 | 9.50 | 0.51 | 816.6 | 0.0 (Ref) | 0.52 | 817.4 | 1.43 |
| | Small | 0.50 | 770.0 | 0.28 | 1249.1 | 50.1 | 0.40 | 813.6 | 37.93 | 0.50 | 800.8 | 11.80 | 0.52 | 790.0 | 10.65 |
| | Moderate | 0.51 | 817.0 | 0.26 | 1197.3 | 48.27 | 0.26 | 746.5 | 44.47 | 0.44 | 788.3 | 8.07 | 0.52 | 799.6 | 6.31 |
| | Large | 0.51 | 817.0 | 0.32 | 1241.3 | 56.28 | 0.41 | 679.4 | 34.74 | 0.31 | 732.1 | 27.06 | 0.47 | 740.3 | 13.32 |

Fig. 6

MOTION CORRECTED TENSOR MAGNETIC RESONANCE IMAGING

CROSS REFERENCE TO RELATED APPLICATIONS

This application claims the benefit of U.S. provisional patent application 61/128,199, filed on May 19, 2008, entitled "Motion Corrected Diffusion Tensor Magnetic Resonance Imaging", and hereby incorporated by reference in its entirety.

FEDERALLY-SPONSORED RESEARCH OR DEVELOPMENT

This invention was made with Government support under contracts EB002711 and RR008706 awarded by the National Institutes of Health. The Government has certain rights in this invention.

FIELD OF THE INVENTION

This invention relates to magnetic resonance imaging.

BACKGROUND

Diffusion-weighted imaging (DWI) has been known for its ability to provide a unique tissue contrast that can be used for early detection of ischemic stroke. Diffusion Tensor Imaging (DTI) is an extension of DWI whereby multiple diffusion-weighted measurements are applied to obtain a diffusion tensor for each pixel. Because of prolonged scan times and motion sensitivity of diffusion weighting gradients, countermeasures to prevent motion-induced artifacts in DTI are important for the success of a study. It is helpful to briefly review some aspects of DWI and DTI. In DWI, a pulsed magnetic field gradient is applied in a specified direction, and then a gradient pulse in the same direction but with opposite magnitude is applied some time later. An alternative and more frequently used MR pulse sequence for DWI is to use two gradient pulses of identical polarity straddling a 180 degree refocusing RF pulse. The resulting image depends on the diffusion constant of the object being imaged in the specified direction. This process can be referred to as "diffusion encoding". For example, the specified direction could be the z-axis, and the resulting image would show contrast depending on how well (or poorly) protons diffuse in the z-direction. Any other direction could also be chosen to provide a DWI image. In diffusion tensor imaging, enough DWI images are obtained to enable a determination of a diffusion tensor for each voxel of the object being imaged. The number of DWI images required depends on the diffusion tensor model employed. For example, if a symmetric second order diffusion tensor is assumed, then at least 6 DWI images with diffusion-encoding along non collinear directions are required for DTI.

Phase contrast MRI is similar to DWI, in the sense that directional qualities of the object affect image contrast. However, in phase contrast MRI, the underlying physical principle is different than in DWI. Phase contrast MRI is based on the property that motion of tissue in a magnetic field gradient produces a change in the net MR signal phase. As in the DWI case described above, the specified direction of the magnetic field gradient sets up a "velocity encoding". For example, the specified direction could be the z-axis, and the resulting image would show contrast depending on tissue motion in the z-direction. Any other gradient direction could also be chosen to provide a phase contrast MRI image with velocity-sensitivity along this direction. For example, the three components of tissue velocity can be obtained from 3 phase contrast MRI images having orthogonal field gradient directions (e.g., x, y, and z gradients+one reference measurement). Alternative strategies, such as Hadamard gradient encoding, can be also used.

Both DWI/DTI and phase contrast MRI are adversely affected by object/patient motion during data acquisition. One way to eliminate the effects of motion (especially for DWI/DTI due to its profound susceptibility to even smallest amount of bulk motion) is to "freeze" the anatomy being imaged by using snapshot imaging techniques—the most popular of which is single shot EPI (sshEPI). However, susceptibility artifacts due to the very low bandwidth per pixel in the phase-encode direction and T2*-induced blurring caused by the long EPI readout substantially limit the applicability of this method. To address the limitations of single-shot EPI, the use of parallel imaging has been suggested. Nevertheless, the maximum speedup in the phase encode direction that can be achieved by parallel imaging is limited and, thus, the degree of distortion reduction. Another method employed frequently is to use interleaved k-space acquisitions to traverse faster through k-space and, in this way, to reduce the aforementioned distortions. However, diffusion-weighted multi-shot sequences are very sensitive to motion. Each interleaf accrues a different (typically non-linear) phase in the image domain. Navigator based methods that utilize 1D navigators, 2D navigators or self-navigating trajectories have demonstrated variable efficacy to eliminate these motion artifacts.

While the phase-navigation used in DTI is usually focused on minuscule motion (i.e. motion in a range that affects image phase but not pixel position), gross patient motion becomes a concern—especially in the case of uncooperative patients such as children and patients that suffer from a specific medical condition (e.g. stroke) that keeps them from staying stationary. Mere misregistration can be corrected for by advanced registration methods. However, motion exposes the object to a different diffusion encoding gradient than the desired one. Neglecting the change in the diffusion encoding caused by motion can cause erroneous estimations of the diffusion tensor orientation and anisotropy.

FIGS. 1a-b illustrate this problem. Let $b_i$ denote the applied diffusion encoding and let $p_i$ represent the tensor orientation, which depends on subject motion. In case of no motion (FIG. 1a), the estimated diffusion tensor (dotted line) is the same as the actual tensor 102 (solid line). If there is rotational motion (FIG. 1b), the estimated tensor orientation 104 can be different from the actual tensor orientations $p_1$, $p_2$, $p_3$, and the anisotropy will be lower than the actual values. The error in Fractional Anisotropy (FA) and orientation will depend on the severity of the motion and the pattern of orientation changes.

The studies on the consequences of gross motion during diffusion encoding are limited; mostly because distortions on a much smaller scale (e.g. brain pulsation and miniscule bulk motion) have often been more of a concern. Recently, an approach to correct for these deviations from the desired encoding has been suggested for sshEPI by Rohde et al., in "Comprehensive Approach for Correction of Motion and Distortion in Diffusion-Weighted MRI", Magnetic Resonance in Medicine, 2004; 51:103-114. In this work, the b-matrix for a single-shot data set is computed, and then rotated to the target coordinates. In this manner, several single-shot data sets, each possibly having different rotations, can be made consistent.

In considering the effect of gross patient motion for DTI, it is helpful to consider two cases. In case A, patient motion during each of the DWI scans is negligible, however, the DWI scans do not necessarily all have the same patient orientation. In case B, patient motion (especially rotation) is not negligible during the DWI scans. The approach of Rhode et al. cited above would be applicable to case A, because each DWI scan is single-shot data. The several DWI images can be made consistent with each other by performing b-matrix rotations as needed so that all DWI images are referred to a common coordinate system. However, the approach of Rhode et al. is not applicable in case B. If patient motion is not negligible during a DWI scan, then the accumulated data for a DWI scan cannot meaningfully be regarded as a DWI image having a specified direction, because this "specified direction" is not constant for the DWI data. Therefore, the conventional 2-step method for tensor estimation—that is 1) the reconstruction of individual diffusion weighted images followed by 2) multivariate regression—cannot be used for multi-shot acquisition of the DWI images.

Accordingly, it would be an advance in the art to provide methods for DWI, DTI, and related methods that are applicable in the case of non-negligible patient motion during data acquisition.

SUMMARY

The problem being addressed can be formulated as follows. In tensor MRI, a set of k-space MRI data points is acquired that includes one or more k-space subsets of MRI data points. An object orientation corresponding to each of the k-space subsets is determined. Because the object orientation can differ from subset to subset, the overall set of k-space data can be inconsistent with respect to object orientation. This possible inconsistency can be addressed by providing a k-space tensor model that includes object orientation information corresponding to each of the subsets. A tensor MRI image can be reconstructed from the set of k-space MRI data points by using the k-space tensor model to account for object orientation.

Here, the term "tensor MRI" includes any MRI imaging method where directional properties or qualities of an object/patient are imaged, including but not limited to: diffusion tensor MRI, diffusion weighted MRI, and phase contrast MRI. The k-space tensor model can have one or more dimensions (i.e., it can be a vector model, a 2-D tensor model, or a higher-order tensor model).

The present methods for correcting for changes in object orientation during tensor MRI can be applied in combination with methods for correcting for motion-induced phase errors during diffusion-encoding of the k-space subsets. A suitable method for correcting for motion-induced phase errors in this context is described in U.S. Pat. No. 7,408,345, incorporated by reference in its entirety. The present methods for correcting for changes in object orientation during tensor MRI can also be applied in combination with methods for providing correction for coil sensitivity, off-resonance, and gradient non-linearities. Preferably, all corrections are applied simultaneously in a unified image reconstruction formulation. A suitable method for correcting for gradient non-uniformities in this context is described in U.S. Pat. No. 6,969,991, incorporated by reference in its entirety.

In preferred embodiments, parallel imaging is used during image reconstruction in order to compensate for k-space undersampling, and/or to accelerate overall data acquisition, and/or to increase k-space data support for diffusion phase correction. A suitable method for parallel imaging in this context is described in U.S. Pat. No. 7,348,776, incorporated by reference in its entirety.

Although any image reconstruction method can be applied to the basic k-space model of the present approach, non-linear conjugate gradient methods are presently preferred. This approach is described in greater detail below.

The present approach is useful in situations where two or more k-space subsets have different object orientations (i.e., the k-space data is inconsistent). The present approach can also be useful in situations where the k-space data is consistent, because object orientation can impair tensor encoding even for consistent k-space data. Such impaired tensor encoding can be alleviated by following the present approach. Individual k-space subsets may or may not provide sufficient information for an image reconstruction. In situations where individual k-space subsets do not provide sufficient information for an image reconstruction (i.e., multi-shot data), the present approach is particularly advantageous.

In performing image reconstruction according to the present approach, it is assumed that the object/patient orientation corresponding to each of the k-space subsets is known. Image space tracking can be employed to provide this orientation information. Tracking can be performed during acquisition of the k-space subsets or after acquisition of the k-space subsets. Tracking can be performed prospectively or retrospectively. Tracking can be performed with an external tracking method or with an MRI-intrinsic tracking method. Suitable tracking methods are well known in the art.

Principles of the present approach can be applied to a broader class of geometrical transformation than rotations. Such generalization entails determining an object spatial transformation corresponding to each of the k-space subsets, and including the object spatial transformation for each of the k-space subsets as inputs for the k-space tensor model. Such spatial transformations can include affine transformations, such as any combination of translation, rotation and linear scaling.

BRIEF DESCRIPTION OF THE DRAWINGS

FIG. 5 is a table of results obtained with the phantom image of FIG. 4.

FIG. 6 is a table of results obtained from in vivo experiments.

DETAILED DESCRIPTION

Figure 1B:
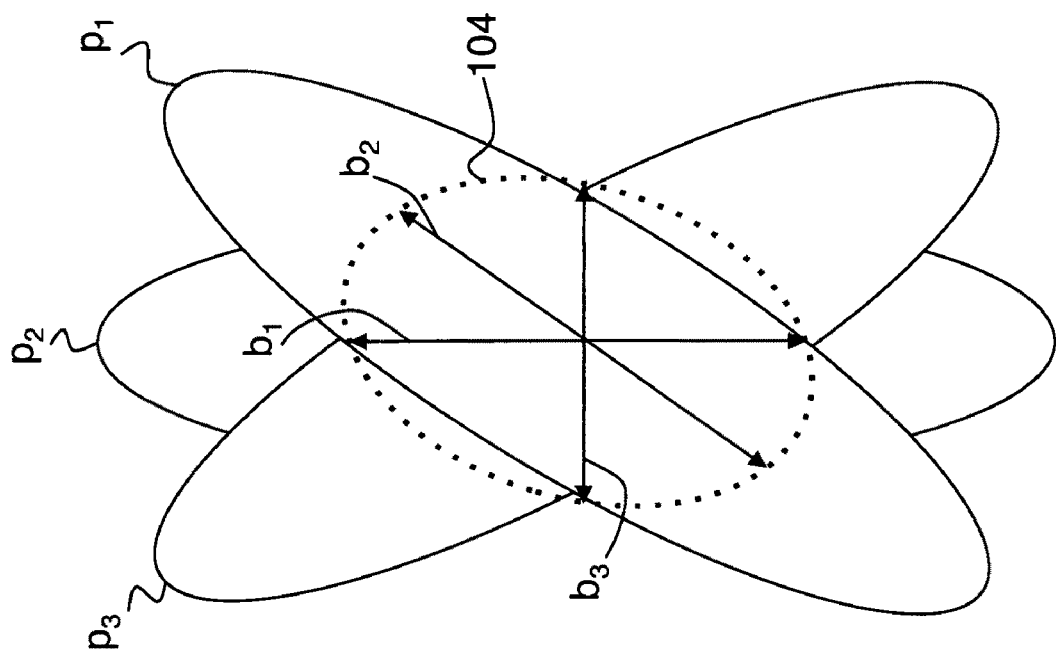
FIGS. 1a-b are diagrams showing the effect of subject rotation on tensor estimation.
Figure 1A:
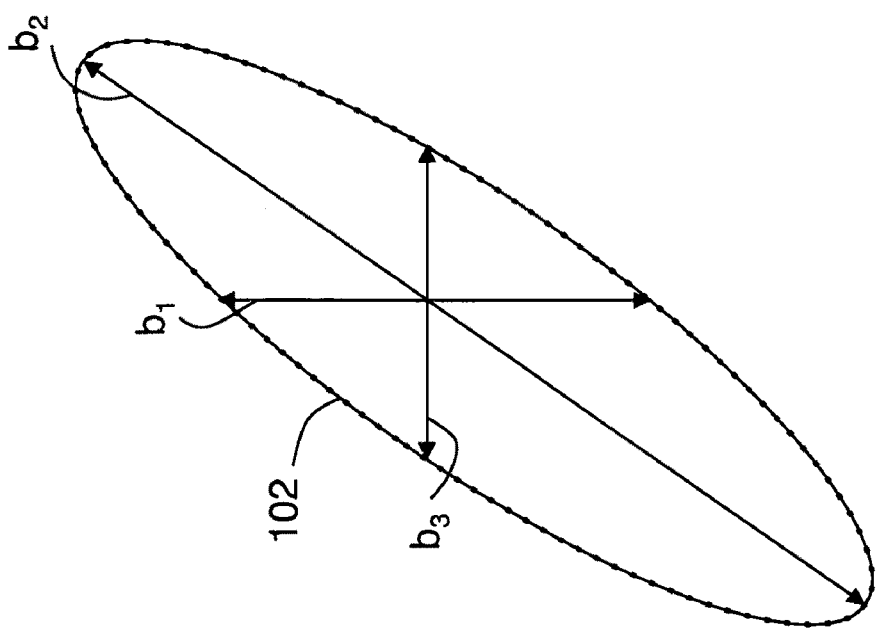

To better appreciate the present approach, it is helpful to begin with a mathematical development relating to diffusion tensor MRI, followed by a discussion of computational and experimental results. In both simulations and experiments, it is demonstrated that the proposed algorithm is efficient in correcting both small and gross interscan motions.

1. THEORY

In the general case when there is no motion, the signal equation for a multi-shot DTI acquisition using a multi-channel coil is given by the following expression:

$$d_{\gamma,\delta,\xi}(\kappa) = \frac{1}{n_\rho} \sum_\rho m(r_\rho) e^{-\sum_{i,l}[b_\delta]_{i,l}[D(r_\rho)]_{i,l}} s_\gamma(r_\rho) e^{-jk_{\xi,\kappa} \cdot r_\rho}, \quad [1]$$

where γ stands for the coil number, δ for diffusion weighting direction number, ξ for interleaf number, κ for k-space point within an interleaf, $n_\rho$ for the number of image space points (=$N^2$), ρ for image space point and i,l for tensor indices (i,l=1, 2, 3). Here, $m(r_\rho)$ is the non-diffusion weighted image and $s_\gamma(r_\rho)$ is the coil sensitivity. The existence of rigid body motion requires Eq. [1] to be modified in order to account for rigid body rotations and translations. Specifically, the artifacts caused by motion are going to be of different nature depending on whether they occur during diffusion encoding (intrascan motion) or between shots (interscan motion).

1.1. Intrascan Motion

In this section, we will focus on small motion that happens while the strong diffusion encoding gradients are played out. Small motion (e.g. brain pulsation) during the application of diffusion-encoding gradients results in an additional, unpredictable phase term that varies spatially and for each interleaf, and needs to be removed prior to reconstruction as it conflicts with regular image encoding.

In this approach, the nonlinear phase accrued for each interleaf is treated as a modification of the underlying image encoding function and in this way it is considered to be part of the complex coil sensitivity in Eq. [1]. Hence, the coil sensitivity maps in Eq. [1] can be modified accordingly to reflect the different spatially-varying (non-linear) phase information $\phi_{\delta,\xi}(r_\rho)$ for each diffusion encoding direction δ and interleaf ξ:

$$s^{(pe)}_{\gamma,\delta,\xi}(r_\rho) = s_\gamma(r_\rho) e^{j\phi_{\delta,\xi}(r_\rho)}. \quad [2]$$

1.2. Interscan Motion

In this section, we will focus on the effect of (rigid body) motion between shots on the diffusion-weighted images. The correction of interscan rotations and translations is based on defining a patient frame of reference and finding the spatial transformations needed to warp images from a reference frame defined by the scanner frame of reference to the patient frame of reference. In other words, in case of motion we are locking on to the patient so that the anatomy under examination is stationary and the scanner (including the RF coil elements and the diffusion encoding gradients) is "moving" around the patient. Using the Fourier Transform properties, the rotational motion is corrected by counter-rotating the k-space trajectories and translational motion is corrected by applying a linear phase to the complex k-space data. In addition, coil sensitivity profiles are also counter-rotated and counter-translated to account for the altered coil sensitivity exposure of the anatomy under examination. Similarly, the diffusion encoding direction will also change due to rotation. Thus, in case when the anatomy under examination is rotated, spins will be exposed to different diffusion-encoding fields that differ from the desired field for each shot.

Following these observations, we can rewrite Eq. [1] in the "scanner-frame-of-reference" after adding the effect of rotation and translation:

$$d_{\gamma,\delta,\xi}(\kappa) = \frac{1}{n_\rho} \sum_\rho m(R_{\delta,\xi} r_\rho + \Delta r_{\delta,\xi}) \quad [3]$$

$$e^{-\sum_{i,l}[b_\delta]_{i,l}[R_{\delta,\xi} D(R_{\delta,\xi} r_\rho + \Delta r_{\delta,\xi}) R^T_{\delta,\xi}]_{i,l}} s^{(pe)}_{\gamma,\delta,\xi}(r_\rho) e^{-jk_{\xi,\kappa} \cdot r_\rho}.$$

Here, $R_{\delta,\xi}$ is the rotation matrix and $\Delta r_{\delta,\xi}$ the translation vector from the scanner frame of reference to the patient frame of reference. The spatial warping which in Eq. 3 resembles rotation and translation can be performed with any linear transformation matrix A, provided that the transform is bijective or at least an approximation to the inverse of the spatial warping exists. Those skilled in the art will recognize from Eq. 3 how to apply the transformation rules. Substituting $r_\rho' = R_{\delta,\xi} r_\rho + \Delta r_{\delta,\xi}$ in the summation represents a transformation from the scanner frame of reference to patient frame of reference, in which case one gets:

$$d_{\gamma,\delta,\xi}(\kappa) = e^{j[R_{\delta,\xi} k_{\xi,\kappa}] \Delta r_{\delta,\xi}} \frac{1}{n_\rho} \sum_\rho m(r_\rho) \quad [4]$$

$$e^{-\sum_{i,l}[R^T_{\delta,\xi} b_\delta R_{\delta,\xi}]_{i,l}[D(r_\rho)]_{i,l}} s^{(pe)}_{\gamma,\delta,\xi}(R^T_{\delta,\xi}(r_\rho - \Delta r_{\delta,\xi})) e^{-j[R_{\delta,\xi} k_{\xi,\kappa}] r_\rho}.$$

Defining $k'_{\delta,\xi,\kappa} \equiv R_{\delta,\xi} k_{\xi,\kappa}$, $b'_{\delta,\xi} \equiv R^T_{\delta,\xi} b_\delta R_{\delta,\xi}$, $s'_{\gamma,\delta,\xi}(r_\rho) \equiv s^{(pe)}_{\gamma,\delta,\xi}(R^T_{\delta,\xi}(r_\rho - \Delta r_{\delta,\xi}))$ and $d'_{\gamma,\delta,\xi}(\kappa) \equiv d_{\gamma,\delta,\xi}(\kappa) \exp\{-j \, k'_{\delta,\xi,\kappa} \cdot \Delta r_{\delta,\xi}\}$, the final equation for a DTI acquisition in the case of rigid body motion becomes:

$$d'_{\gamma,\delta,\xi}(\kappa) = \frac{1}{n_\rho} \sum_\rho m(r_\rho) e^{-\sum_{i,l}[b'_{\delta,\xi}]_{i,l}[D(r_\rho)]_{i,l}} s'_{\gamma,\delta,\xi}(r_\rho) e^{-jk'_{\delta,\xi,\kappa} \cdot r_\rho}. \quad [5]$$

Conventional tensor estimation schemes do not consider gross rigid body motion. In these schemes, Eq. [1] is solved for $D(r_\rho)$ in two steps: 1) Reconstruction of δ diffusion weighted images $$m(r_\rho) e^{-\sum_{i,l}[b_\delta]_{i,l}[D(r_\rho)]_{i,l}} \quad 2)$$

calculation of diffusion tensors $D(r_\rho)$ from diffusion weighted images using multivariate regression. However, if there is rigid body motion, the diffusion weighted image corresponding to each interleaf is given by $$m(r_\rho) e^{-\sum_{i,l}[b'_{\delta,\xi}]_{i,l}[D(r_\rho)]_{i,l}}.$$

Since each interleaf has essentially undergone a different diffusion encoding, it becomes unfeasible to reconstruct correct individual diffusion weighted images. In this study, a single step optimization algorithm to estimate the diffusion tensors $D(r_\rho)$ from the unity of all k-space data is presented. The interleafs in the preceding equations can be regarded as examples of the above-described k-space subsets, since a specific orientation is associated with each interleaf, and the interleafs can have different orientations. Furthermore, Eq. 5 provides an example of the above-described k-space tensor model. More specifically, d' is obtained from k-space MRI data, and is equated to a model that is a Fourier transform (with respect to k') of the diffusion-weighted (exp(−b'D) factor) and motion-dependent coil-sensitivity modulated (s' factor) image (m factor). The effect of the orientation of each interleaf on the diffusion encoding is accounted for in the b' factor.

1.3 Non-Linear Conjugate Gradient Method for Direct Tensor Estimation

Figure 2:
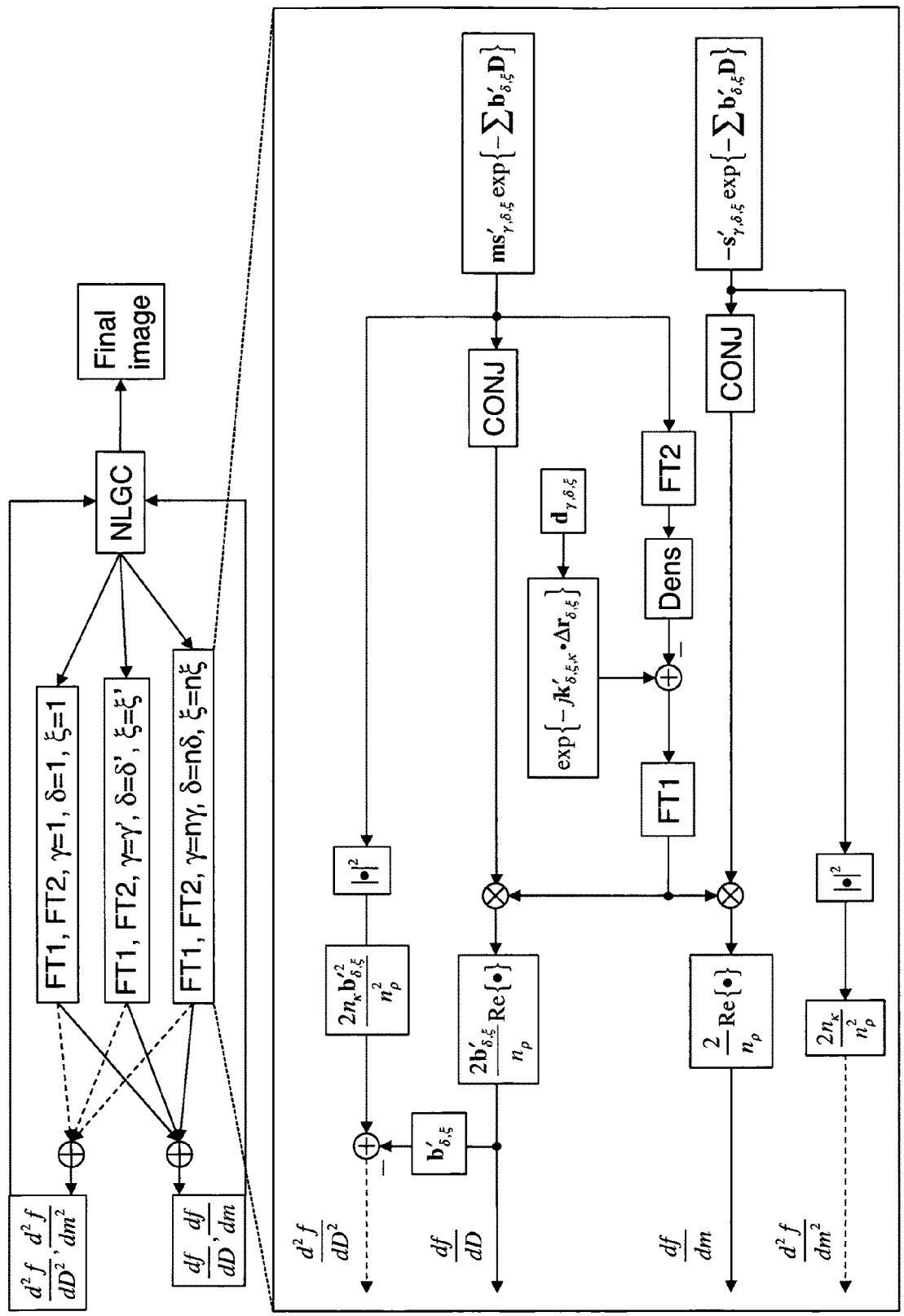
FIG. 2 is a flowchart of a reconstruction method according to an embodiment of the invention.

In Eq. [5], the unknowns to be determined are the diffusion tensors $D(r_\rho)$ and the non-diffusion weighted image $m(r_\rho)$. To solve for D and m simultaneously, a nonlinear conjugate gradient based method is needed to solve the cost function $f(D,m)$ defined in Eq. [6] below. A flow chart showing the iterative reconstruction algorithm to obtain the diffusion tensor information on a per pixel basis is shown in FIG. 2. This flow chart shows how evaluation of the derivative of $f(D,m)$ with respect to $D(r_\rho)$ and $m(r_\rho)$ can be carried out efficiently by using inverse and forward gridding, represented by FT1 and FT2.

In essence, this algorithm tries to minimize the error (in a least squares sense) between the acquired k-space data d and the corresponding k-space data following our model approach after factoring in motion terms (i.e. phase error, rotation, translation):

$$f(D,m) = \sum_{\gamma,\delta,\xi,\kappa} \left| \frac{d'_{\gamma,\delta,\xi}(\kappa) - \frac{1}{n_\rho}\sum_\rho m(r_\rho)}{e^{-\sum_{i,l}[b'_{\delta,\xi}]_{i,l}[D(r_\rho)]_{i,l}} s'_{\gamma,\delta,\xi}(r_\rho)e^{-jk'_{\delta,\xi,\kappa}\cdot r_\rho}} \right|^2 \quad [6]$$

In order to minimize the cost function $f(D,m)$, a non-linear conjugate gradient (NLCG) method with Polak-Ribiere and Secant 1D line search was used. Inherent to all variants of conjugate gradient methods (CG) is their fast convergence rates, the minimal number of function evaluations, low memory requirements and the non-necessity of evaluating the exact Hessian matrix—rendering them ideal for solving high dimensional optimization problems. In this sense, CG methods are more memory efficient and converge faster compared to other methods such as Levenberg-Marquardt or Steepest Descent.

The NLCG approach requires the evaluation of the first derivative vector with respect to the unknown parameters at each iteration step. Since this evaluation is a major time limiting factor for the reconstruction, a fast algorithm was introduced which is based on forward and inverse gridding to evaluate the first and second derivative of the cost function with respect to the diffusion tensors D and the non-diffusion weighted image m. By defining a diffusion-weighted image for the $\gamma^{th}$ coil, $\delta^{th}$ diffusion weighting and $\xi^{th}$ interleaf as $$dwi_{\gamma,\delta,\xi}(r_\rho) = m(r_\rho)e^{-\sum_{i,l}[b'_{\delta,\xi}]_{i,l}[D(r_\rho)]_{i,l}} s'_{\gamma,\delta,\xi}(r_\rho), \quad [7]$$

the cost function can be rewritten as $$f(D,m) = \sum_{\gamma,\delta,\xi,\kappa} \left[ d'_{\gamma,\delta,\xi}(\kappa) - \frac{1}{n_\rho}\sum_\rho dwi_{\gamma,\delta,\xi}(r_\rho)e^{-jk'_{\delta,\xi,\kappa}\cdot r_\rho} \right] \quad [8]$$

$$\left[ d'_{\gamma,\delta,\xi}(\kappa) - \frac{1}{n_\rho}\sum_\rho dwi_{\gamma,\delta,\xi}(r_\rho)e^{-jk'_{\delta,\xi,\kappa}\cdot r_\rho} \right]^*.$$

Here, $[\bullet]^*$ denotes the complex conjugate. The first derivative of this cost function with respect to the $(i,l)^{th}$ (i,l=1, 2, 3) element of the diffusion tensor at location $r_\rho$ ($\rho=1\ldots N^2$) becomes:

$$\frac{df(D,m)}{d[D(r_\rho)]_{i,l}} = \sum_{\gamma,\delta,\xi,\kappa} \left\{ \begin{array}{l} \left[ d'_{\gamma,\delta,\xi}(\kappa) - \frac{1}{n_\rho}\sum_{\rho'} dwi_{\gamma,\delta,\xi}(r_{\rho'})e^{-jk'_{\delta,\xi,\kappa}\cdot r_{\rho'}} \right] \\ \left[ \frac{1}{n_\rho}dwi_{\gamma,\delta,\xi}(r_\rho)e^{-jk'_{\delta,\xi,\kappa}\cdot r_\rho}[b'_{\delta,\xi}]_{i,l} \right]^* + \\ \left[ \frac{1}{n_\rho}dwi_{\gamma,\delta,\xi}(r_\rho)e^{-jk'_{\delta,\xi,\kappa}\cdot r_\rho}[b'_{\delta,\xi}]_{i,l} \right] \\ \left[ d'_{\gamma,\delta,\xi}(\kappa) - \frac{1}{n_\rho}\sum_{\rho'} dwi_{\gamma,\delta,\xi}(r_{\rho'})e^{-jk'_{\delta,\xi,\kappa}\cdot r_{\rho'}} \right]^* \end{array} \right\}. \quad [9]$$

The evaluation of Eq. [9] takes a significant amount of effort due to the inner summations over $\rho$. In fact, these summations represent a discrete Fourier transform (DFT) of the dwi image (Eq. [7]) onto an arbitrary k-space trajectory given by $k_{\delta,\xi,\kappa}$. Therefore, this DFT operation can be sped up significantly by approximating it by an inverse FFT followed by an inverse gridding operation:

$$DWI_{\gamma,\delta,\xi}(\kappa) = \frac{1}{n_\rho}\sum_{\rho'} dwi_{\gamma,\delta,\xi}(r_{\rho'})e^{-jk'_{\delta,\xi,\kappa}\cdot r_{\rho'}} \quad [10]$$

$$\approx GRID^{-1}_{\delta,\xi}\{FFT\{dwi_{\gamma,\delta,\xi}(r_{\rho'})\}\}.$$

Here, $GRID^{-1}_{\delta,\xi}$ denotes the inverse gridding operation of Cartesian DWI data onto the $\xi^{th}$ interleaf of the $\delta^{th}$ diffusion weighting direction. This operation is represented by $$DWI_{\gamma,\delta,\xi}(\kappa) \approx FT2_{\delta,\xi}\{dwi_{\gamma,\delta,\xi}(r_\rho)\}, \quad [11]$$

Here, FT2 includes roll-off correction, zero padding to 2× grid, FFT into k-space and inverse gridding. This way, Eq. [11] becomes:

$$\frac{df(D,m)}{d[D(r_\rho)]_{i,l}} = \sum_{\gamma,\delta,\xi,\kappa} \left\{ \begin{array}{l} [d'_{\gamma,\delta,\xi}(k'_{\delta,\xi,\kappa}) - DWI_{\gamma,\delta,\xi}(k'_{\delta,\xi,\kappa})] \\ \left[ \frac{1}{n_\rho}dwi_{\gamma,\delta,\xi}(r_\rho)e^{-jk'_{\delta,\xi,\kappa}\cdot r_\rho 1}[b'_{\delta,\xi}]_{i,l} \right]^* + \\ \left[ \frac{1}{n_\rho}dwi_{\gamma,\delta,\xi}(r_\rho)e^{-jk'_{\delta,\xi,\kappa}\cdot r_\rho 1}[b'_{\delta,\xi}]_{i,l} \right] \\ [d'_{\gamma,\delta,\xi}(k'_{\delta,\xi,\kappa}) - DWI_{\gamma,\delta,\xi}(k'_{\delta,\xi,\kappa})]^* \end{array} \right\}, \quad [12]$$

which eventually evaluates to $$\frac{df(D,m)}{d[D(r_\rho)]_{i,l}} = \sum_{\gamma,\delta,\xi} \left\{ \begin{array}{l} \left\{ \sum_\kappa \left[ \begin{array}{l} d'_{\gamma,\delta,\xi}(k'_{\delta,\xi,\kappa}) - \\ DWI_{\gamma,\delta,\xi}(k'_{\delta,\xi,\kappa}) \end{array} \right] e^{jk'_{\delta,\xi,\kappa} \cdot r_\rho} \right\} \\ \frac{1}{n_\rho} dwi^*_{\gamma,\delta,\xi}(r_\rho)[b'_{\delta,\xi}]_{i,l} + \\ \left\{ \sum_\kappa \left[ \begin{array}{l} d'_{\gamma,\delta,\xi}(k'_{\delta,\xi,\kappa}) - \\ DWI_{\gamma,\delta,\xi}(k'_{\delta,\xi,\kappa}) \end{array} \right] e^{jk'_{\delta,\xi,\kappa} \cdot r_\rho} \right\}^* \\ \frac{1}{n_\rho} dwi_{\gamma,\delta,\xi}(r_\rho)[b'_{\delta,\xi}]_{i,l} \end{array} \right\} \quad [13]$$

From Eq. [13] it can be seen that the inner summations over all k-space sample points κ represent an inverse discrete Fourier Transform. Again, this inverse DFT can be replaced with forward gridding and FFT to improve efficiency:

$$dwi'_{\gamma,\delta,\xi}(r_\rho) = \sum_\kappa [d'_{\gamma,\delta,\xi}(\kappa) - DWI_{\gamma,\delta,\xi}(\kappa)] e^{jk'_{\delta,\xi,\kappa} \cdot r_\rho} \quad [14]$$

$$\approx IFFT\{GRID_{\delta,\xi}\{d'_{\gamma,\delta,\xi}(\kappa) - DWI_{\gamma,\delta,\xi}(\kappa)\}\}$$

$$= FT1_{\delta,\xi}\{d'_{\gamma,\delta,\xi}(\kappa) - DWI_{\gamma,\delta,\xi}(\kappa)\}.$$

Here, $GRID_{\delta,\xi}$ denotes forward gridding and FT1 operation includes forward gridding on a 2× grid, FFT into image domain, matrix cropping, and roll-off correction. Finally, Eq. [9] can be simplified to $$\frac{df(D,m)}{d[D(r_\rho)]_{i,l}} = \frac{1}{n_\rho} \sum_{\gamma,\delta,\xi} 2\text{Re}\{dwi'_{\gamma,\delta,\xi}(r_\rho) dwi^{\prime*}_{\gamma,\delta,\xi}(r_\rho)\}[b'_{\delta,\xi}]_{i,l}. \quad [15]$$

Here, the Re{•} operation stands for taking the real part of the argument within the curly braces. It is possible to improve the convergence rate of the NLCG method using preconditioners or by improving the line search for each search direction. Both of these are possible by finding an approximation of the Hessian matrix. This approximation includes only the diagonal entries of the Hessian matrix, with the cost of increasing the number of iterations in 1D line searches or imperfect regularization. Using similar methods as described above, the second derivative of the cost function with respect to the tensor elements becomes:

$$\frac{d^2 f(D,m)}{d[D(r_\rho)]^2_{i,l}} = \sum_{\gamma,\delta,\xi} \left\{ \left[ \begin{array}{l} \frac{2n_\kappa}{n_\rho^2} |dwi'_{\gamma,\delta,\xi}(r_\rho)|^2 - \\ \frac{1}{n_\rho} 2\text{Re}\left\{ \begin{array}{l} dwi'_{\gamma,\delta,\xi}(r_\rho) \\ dwi^{\prime*}_{\gamma,\delta,\xi}(r_\rho) \end{array} \right\} \end{array} \right] [b'_{\delta,\xi}]^2_{i,l} \right\} \quad [16]$$

where $n_\kappa$ is the number of k-space points per interleaf.

Using a very similar approach, it is possible to evaluate the first and second derivative of the cost function with respect to the non-diffusion weighted image:

$$\frac{df(D,m)}{d[m(r_\rho)]_{i,l}} = -\frac{1}{n_\rho} \sum_{\gamma,\delta,\xi} 2\text{Re}\left\{ \begin{array}{l} dwi'_{\gamma,\delta,\xi}(r_\rho) \\ e^{-\sum_{i,l}[b'_{\delta,\xi}]_{i,l}[D(r_\rho)]_{i,l}} s^{\prime*}_{\gamma,\delta,\xi}(r_\rho) \end{array} \right\} \quad [17]$$

$$\frac{d^2 f(D,m)}{d[m(r_\rho)]^2_{i,l}} = \sum_{\gamma,\delta,\xi} \left\{ \frac{2n_\kappa}{n_\rho^2} \left| e^{-\sum_{i,l}[b'_{\delta,\xi}]_{i,l}[D(r_\rho)]} s^{\prime*}_{\gamma,\delta,\xi}(r_\rho) \right|^2 \right\} \quad [18]$$

Because the units of D (s/mm$^2$) and m (a.u.) are different, their scaling will also be different. In this case, preconditioning becomes necessary to bring these parameters to the same scaling in order to speed up convergence. In this study, regularization was accomplished using the diagonal Hessian matrices, as given by [16] and [18].

2 MATERIALS AND METHODS

2.1 Pulse Sequence

Figure 3:
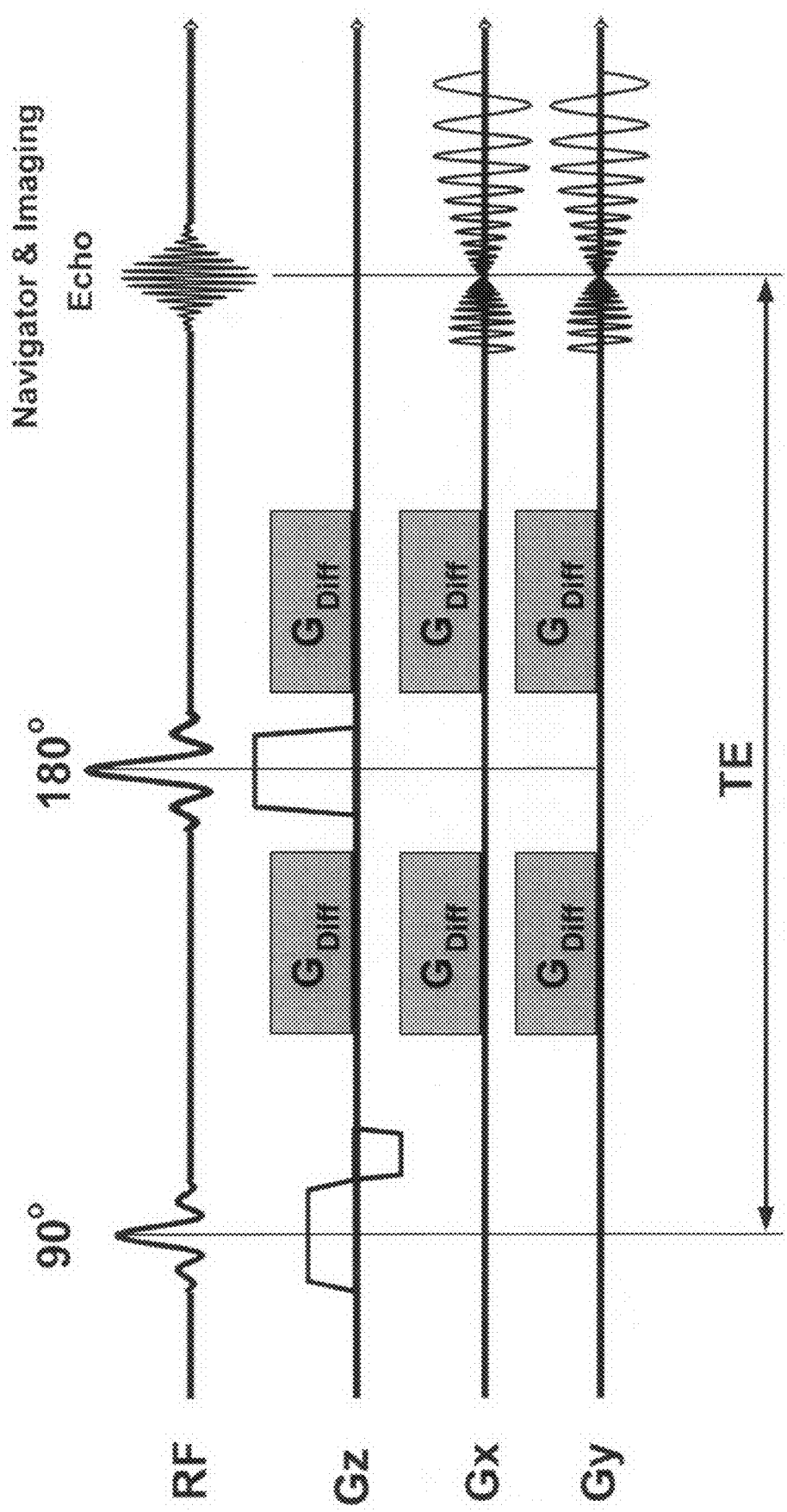
FIG. 3 shows a pulse sequence used for in vivo studies.

For this study, a diffusion-weighted spin echo single-shot spiral-in and interleaved spiral-out sequence was used, as shown on FIG. 3. The readout part includes a single-shot spiral-in and an interleaved variable-density spiral-out acquisition. The spiral in readout gives a low resolution navigator image that can be used to estimate the amount of gross patient motion for each shot. In addition the navigator is used for coil sensitivity estimation, non-linear phase correction and the elimination of irreversibly corrupted k-space data. The variable-density spiral out readout makes up one interleaf of the final k-space data to form a high resolution diffusion-weighted image. The motion parameters (rotation and translation) were then obtained by using the low-resolution navigator images and performing image co-registration. In this study, the Pearson Correlation Coefficient and simplex-based optimization were used to find the motion parameters, but other registration methods or positional detection methods could be used without loss of generality. The coil sensitivities were also obtained from these low resolution navigator images to capture the non-linear phase accrued by each interleaf. Recently, it has been shown that navigators of 32×32 are of sufficient resolution to reliably identify motion of the extent we are trying to correct for with this approach.

2.2 Computer Simulations

Figure 4:
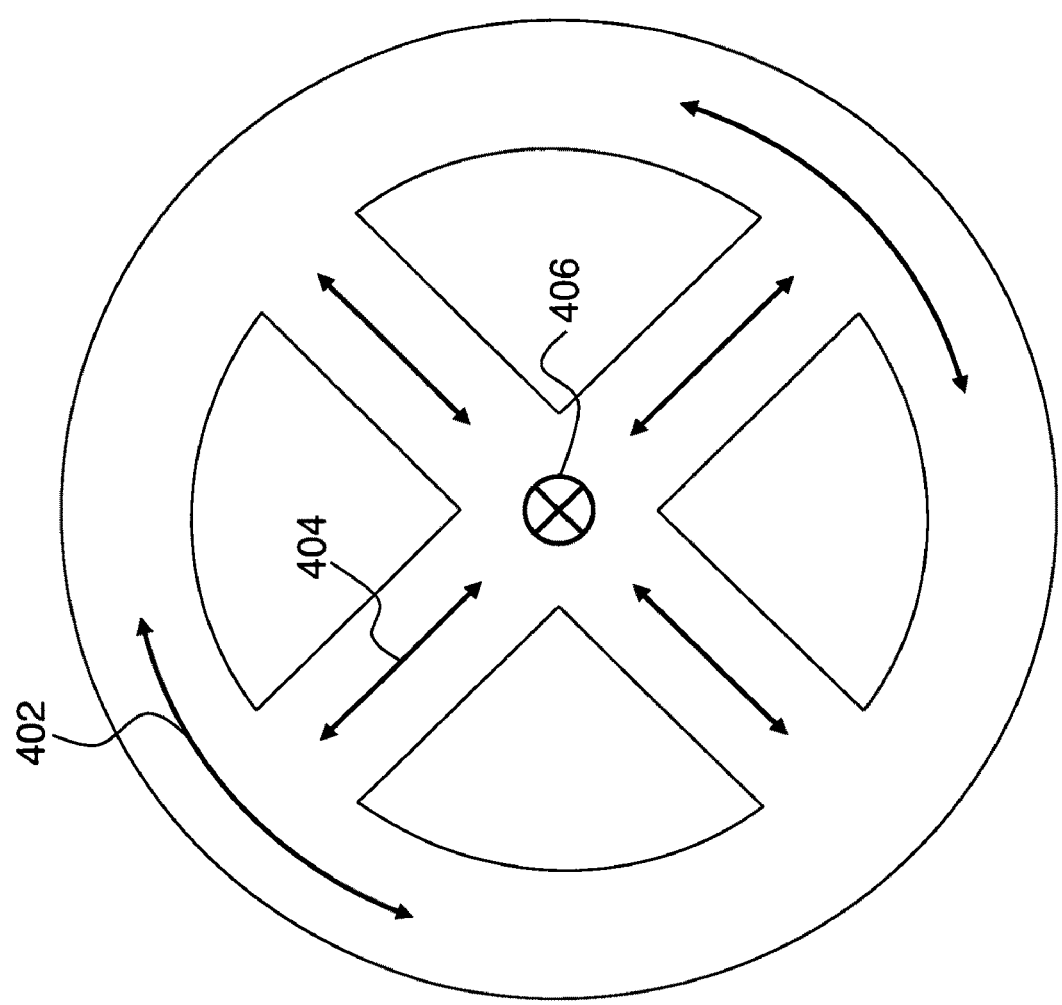
FIG. 4 shows a phantom image used for computer simulations.

All simulations and post processing steps were performed on a PC (Dell, Pentium IV 3.4 GHz, 2.5 GB 14) running IDL 6.1 Student Edition (RSI, Boulder, Colo., USA). Synthetic data for 8-interleaf variable-density spiral (pitch factor=3.0) (29) and 8-interleaf EPI acquisitions were generated using a synthetic DTI dataset containing 6 tensor element images and one image with no diffusion weighting. The synthetic phantom contained a circular ring and two crossing rods (FIG. 4). The major eigenvalue $\lambda_1$ was assumed to be $1000 \times 10^{-6}$ mm$^2$/s, whilst $\lambda_2$ and $\lambda_3$ were both $100 \times 10^{-6}$ mm$^2$/s. The FA value inside the phantom is 0.88. For the circular ring the tensors were oriented so that the major eigenvector $e_1$ was along the tangent of the ring (e.g., 402). For the two crossing rods $e_1$ was oriented along the rods (e.g., 404), and for the area where the rods intersect $e_1$ was pointing perpendicular to the plane of the phantom (e.g., 406).

Complex k-space data were generated using the model in Eq. [3]. First, the $n_\delta \times n_\xi$ diffusion weighted images were obtained with the diffusion gradient directions [(0 0 0)$^T$, (1 1 0)$^T$, (1 0 1)$^T$, (0 1 −1)$^T$, (−1 1 0)$^T$, (0 1 1)$^T$, (1 0 −1)$^T$] and b=800 s/mm$^2$. Rotation, translation and random phase in image domain were simulated. In order to simulate the effect of rotation, the diffusion tensors D(r$_\rho$) and the image were rotated according to Eq. [3]. Thereafter, diffusion weighting was applied by multiplying the non-diffusion weighted image by the diffusion weighting exponential term. Next, the image rotation was established via IDL's built in rot function which uses bicubic interpolation to resample the motion simulated image onto a Cartesian grid. Translation of the image was accomplished by applying a linear phase in the Fourier domain. The random phase was simulated by applying a linear phase in the image domain. Next, these images were multiplied by eight coil sensitivities to simulate diffusion weighted images $dwi_{\gamma,\delta,\xi}(r_\rho)$ obtained with a phased array coil. After FFT, these $n_\gamma \times n_\delta \times n_\xi$ (=8×7×8=448) images were inverse gridded onto the prescribed variable-density spiral trajectory to create the synthetic k-space data. The coil sensitivities were also altered to include the effect of random linear phase. The simulations were carried out with:

1) No motion;
2) $\theta=\pm 10°$ rotation with probability of ½ for each angle, $\Delta r=\pm 1.3$ pixels translation with probability of ½ for each shift, and $\phi=\pm 1$ pixel shift in k-space, uniformly distributed; and
3) $\theta=\pm 20°$ rotation with probability of ½ for each angle, $\Delta r=\pm 2.6$ pixels translation with probability of ½ for each shift and $\phi=\pm 2$ pixel shift in k-space, uniformly distributed.

To assess the performance of our motion correction algorithm, the generated data was reconstructed using four methods:

A) Reconstruction with no motion correction using conventional gridding: individual diffusion-weighted images were generated by means of gridding reconstruction of simulated k-space data. Thereafter, multivariate regression was performed to estimate the elements of the diffusion tensor in each voxel.
B) Reconstruction with phase correction using CG-SENSE: Using the approach in Liu et al. "Simultaneous Phase Correction and SENSE Reconstruction for Navigated Multi-Shot DWI with Non-Cartesian k-Space Sampling", Magnetic Resonance in Medicine 2005; 54:1412-1422, incorporated by reference in its entirety, an augmented iterative SENSE reconstruction was used to obtain diffusion-weighted images. In this method, the conventional coil sensitivity was expanded by the phase map that reflects the effect of motion during diffusion-encoding. Again, pixel-wise estimation of the diffusion tensor elements was performed by multivariate regression.
C) Reconstruction with phase & motion correction using CG-SENSE: In this approach, individual diffusion-weighted images were reconstructed using augmented iterative SENSE reconstruction (as in the Lui et al. reference cited immediately above) and motion correction (as in Bammer et al. "Augmented Generalized SENSE Reconstruction to Correct for Rigid Body Motion", Magnetic Resonance in Medicine 2007; 57:90-102, incorporated by reference in its entirety). Similar to A and B, tensor elements were computed by multivariate regression. However, the change in the b matrix due to motion, particularly rotation, was neglected.
D) Reconstruction with phase & motion & diffusion encoding direction correction: Direct estimation of the tensor element maps was performed using NLCG under the consideration of rigid body motion, phase errors due to motion during the presence of diffusion-encoding and diffusion-encoding errors due to rigid body motion (i.e., the present approach).

In order to eliminate errors that may result from inaccuracies in motion detection, that is, registration inaccuracies, the motion parameters assumed for the simulation (i.e., simulated rotation) were directly used during reconstruction. The coil sensitivities used to perform the simulations were also included directly in the reconstruction after the addition of random linear phase to eliminate any errors that might arise due to the inaccuracies in coil sensitivity estimation. The four reconstructed images were compared with the original reference image. Three measures were used to assess the performance of our algorithm: 1) FA maps; 2) mean diffusivity maps; and the 3) angular deviation between the major eigenvectors of the original image and the reconstructed images in each voxel.

2.3 In-Vivo Studies

In-vivo studies were carried out on four volunteers on a 1.5 T whole body system (Signa CVi; GE, Milwaukee, Wis., USA) with a high performance gradient set (maximum gradient strength=50 mT/m, maximum slew rate=150 mT/m/s). Signal reception was accomplished using an 8-channel receive only head array coil (MRI devices, Milwaukee, Wis., USA), while signal excitation was performed with the integrated quadrature body coil. All human studies were approved by the internal review board of our institution. Informed written consent was obtained from the subject after the nature of the study was fully explained to them.

The DTI sequence used for this in-vivo study employed a single-shot spiral-in and an interleaved variable-density spiral-out readout, where the center of k-space was acquired at the instance when the diffusion-weighted spin echo was formed (FIG. 3). The scan parameters were as follows: TR/TE=2500/55 ms, six diffusion gradient directions [$(1\ 1\ 0)^T, (1\ 0\ 1)^T, (0\ 1\ -1)^T, (-1\ 1\ 0)^T, (0\ 1\ 1)^T, (1\ 0\ -1)^T$], NEX=4, matrix size=128×128, navigator matrix size=32×32, 8 interleaves, variable density pitch factor=3. Two extra scans were also obtained with no diffusion weighting (i.e. with the diffusion-encoding gradients turned off).

During the acquisition of DTI data, the subjects were asked to move their head by a varying extent. Specifically, the subject performed a fast head rotation, followed by 20 to 30 seconds in the resting state. The head rotation was approximately around the axis defined by the point where the subject's head was touching the coil and the line parallel to the $B_o$ field. Using the same parameters, an additional reference DTI scan was also obtained where the subject was asked to stay stationary. This acquisition was deemed the gold standard for our comparative evaluations. The four reconstruction methods as described for the Computer Simulations section were used to reconstruct the in-vivo data.

To evaluate the quality and performance of the reconstruction algorithms, two ROIs were selected in the genu and splenium of the corpus callosum. The performance metrics described for the phantom study were used to evaluate the quality of reconstruction in these areas. The image reconstructed with method C (phase and motion correction using iterative SENSE) in the case of no subject motion was used as a reference for all the reconstructed images and for all degrees of motion. In order to guarantee alignment between the reconstructed images and the reference image, registration between the non-diffusion weighted images and the diffusion tensor maps were accomplished before the comparisons were done.

3 RESULTS 3.1 Computer Simulations

FA maps showed the following results. In the case of no simulated motion, all methods perform similarly. In the case of simulated rotational motion, the application of motion correction with method C (CG SENSE with motion correction) improves the image quality compared to methods A (conventional gridding) and B (CG SENSE with no motion correction). However, since the change in diffusion encoding direction was not accounted for, some residual fluctuations in the FA maps still remain in method C. The application of method D (NLCG) removes these fluctuations and yields a completely uniform FA map, which was very similar to the gold standard Maps of angular deviation of the major eigenvectors between the reconstructed and original (motion-free) image showed the following results. In the absence of simulated motion, all methods performed similarly, as seen by the low angular deviation of the major eigenvectors from the reference orientations. In the case of simulated motion, the application of methods A and B caused the major eigenvectors to deviate significantly from the true values because of motion-related artifacts. After the application of motion correction with method C, the deviation decreased but some residual error remained. This is due to unaccounted changes in diffusion-weighting directions following conventional motion correction. When accounting for the change in the diffusion encoding direction by using method D, the error significantly decreased.

The efficacy of NLCG in eliminating rigid body motion related artifacts can also be seen in the tabulated results of FIG. 5. For all datasets, $FA_{REF}=0.88$ and $meandif_{REF}=371\times 10^{-6}$ mm$^2$/sec. Here the average angular deviation (in degrees), FA, and mean diffusivity (in $10^{-6}$ mm$^2$/sec) over the whole phantom are given. When there is no motion, all methods perform similarly—as seen by the low angular deviation (~0.1° maximum) and the closeness of the FA (0.88) and mean diffusivity values (371–373×$10^{-6}$ mm$^2$/sec) to the reference values of $FA_{ref}=0.88$ and $MeanDif_{ref}=371\times10^{-6}$ mm$^2$/sec. In the case of simulated motion, the mean angular deviation decreased significantly by the application of NLCG (method D) compared to CG-SENSE (method C) from 2.82 and 8.48 degrees to 0.22 and 0.26 degrees, respectively, for the two degrees of simulated motion in case of EPI and from 2.10 and 7.09 to 0.18 and 0.19 in case of vd-spiral. On the other hand, application of method D also increased the mean FA slightly for all simulations with motion—consistent with the fact that uncorrected diffusion encoding directions can cause a decrease in the measured FA value. The mean FA values obtained by method D are around 0.88 for all degrees of simulated motion, which is identical to the real value. No significant change in mean diffusivity was observed between methods C and D. This was due to the fact that the mean diffusivity is, by definition, independent of the orientation of the tensor.

3.2 In-Vivo Studies

The four methods explained in section 2.2 were evaluated for the cases of negligible ($\theta \approx \pm 1°$ rotation, $\Delta r \approx \pm 0.05$ pixels translation), small ($\theta \approx \pm 7°$ rotation, $\Delta r \approx \pm 2$ pixels translation), moderate ($\theta \approx \pm 20°$ rotation, $\Delta r \approx \pm 3$ pixels translation), and large ($\theta \approx \pm 50°$ rotation, $\Delta r \approx \pm 5$ pixels translation) subject motion.

FA maps showed the following results. Without phase correction (method A), all images showed significant artifacts resulting from the random non-linear phase accrued during the diffusion encoding part of each interleaf and positional changes. In the case of no subject motion, method D performed very similarly to method C, as shown by the similarity in the FA maps. In the presence of patient motion, method C increases the quality of the FA maps significantly. Accounting for the altered diffusion encoding direction using method D introduced improvement in image quality over method C in the case of moderate motion. For the case of large subject motion, the improvement in image quality of the FA map derived from method D over C was even more pronounced.

These results are also shown in the tabulated results of FIG. 6. This table reports the average FA, mean diffusivity and angular deviation values in the selected ROIs in the splenium and genu of the corpus callosum. These data show that in the case of no subject motion, the average angular deviation between the eigenvectors corresponding to the tensor data reconstructed with methods C and D is around 2 degrees, and the average FA values (0.68, 0.69) are close to each other. In other words, in the absence of motion, application of NLCG does not introduce additional errors compared to the conventional method. However, in the presence of subject motion, correcting for the altered b matrix produces an eigenvector field that is more aligned with the reference orientation. Moreover, after application of the NLCG reconstruction, FA values resembled more closely to the values from the reference data set than any other method.

4. DISCUSSION

Due to its prolonged acquisition time, the correction of motion artifacts in DTI is important to guarantee accurate image quality and assure the accuracy of the diffusion tensors. In the past, attempts to perform motion correction for diffusion tensor imaging have been limited to correction for miniscule motion. While these methods predominantly correct for unwanted phase terms, gross patient motion correction must account for both unwanted phase terms and changes in the effective diffusion encoding direction. A few DTI studies have proposed correction methods for gross patient motion so far, however these methods were limited to single shot scans. Several software packages offer one the ability to co-register individual diffusion-weighted images prior to computing the tensor. However, as shown in this study, only correcting for altered patient position is insufficient to provide accurate tensor maps. This is because body motion has two effects on the DTI data: i) positional displacement; ii) rotation of the effective diffusion encoding gradient with respect to the patient frame of reference due to rotational motion and, thus, the incorrect estimation of the orientation of the tensors.

The correction for the first of these two effects is straightforward. For single-shot sequences, the second effect can be accounted for by rotating the b-matrix according to the positional changes that occurred during the acquisition of each diffusion-weighted image (relative to a reference position) prior to the estimation of the diffusion tensor. For multi-shot approaches the situation is more complicated. In this case, patient motion, particularly rotation, causes the diffusion encoding matrix b to vary between different shots. This, in turn, leads to a k-space with inconsistent diffusion encoding and affects the accuracy of tensor information derived from such data. This data inconsistency was the motivation for the introduction of a novel mathematical framework that allows one to solve for diffusion tensor information in each pixel in the presence of both macroscopic and microscopic motion. Despite the fact that only translational and rotational motion were considered in this study, it should be noted that rigid motion can be represented by a set of affine transformations. Thus, it is straightforward to extend the algorithm to account for affine transformations as long as the affine transformation parameters can be obtained from low resolution navigators or using any other method. It is also possible to extend this algorithm to correct for general rigid and non-rigid motion as long as the displacement field and the effect of nonrigid motion on diffusion tensors are known. Unless DTI experiments are performed on a gradient system with noticeable gradient non-linearities, the errors introduced by translational motion on diffusion tensor orientation can typically be neglected.

In this context, it is important to mention that the mathematical framework presented here also applies to under-sampled k-space data, i.e. parallel imaging. This allows one to utilize the methods proposed in this study to perform parallel imaging reconstruction with acceleration factors greater than one. Another important motivation of using parallel imaging techniques in the presence of rigid body motion is that, counter-rotation of k-space trajectories for rotation correction creates undersampling in k-space and residual artifacts in the final motion corrected image (e.g., as described in Bammer et al. "Augmented Generalized SENSE Reconstruction to Correct for Rigid Body Motion", Magnetic Resonance in Medicine 2007; 57:90-102). These gaps can be filled up by parallel imaging.

The performance of our algorithm was evaluated using both computer simulations and in-vivo studies. The images reconstructed with no application of gross motion correction showed significant artifacts. The application of motion correction with the standard two-step algorithm (method C) successfully removed most of these artifacts; however, some error remained due to the varying diffusion encoding directions between successive interleaves—as shown by the lowered FA values and considerable deviation in the orientation of the major eigenvectors relative to reference values. With the application of the proposed NLCG method (method D), the error could be reduced even further. Some residual artifacts remained in the in-vivo images which were due most likely to through-plane motion, misregistration, and inaccuracies in the estimation of coil sensitivities. Through-plane motion and spin history effects are a general limitation of retrospective correction methods.

Our algorithm was also shown to work for a wide range of motions. The algorithm was demonstrated with rotation angles as large as 50°. For the other end of the spectrum of motion, it is also important to point out that in the absence of motion the NLCG (method D) provided similar results as the augmented iterative SENSE (method C). Do note that in order to avoid unwanted blurring introduced by potential slight positional inaccuracies of our motion detection, only motion above a certain threshold (typically the precision of our co-registration method) was considered true motion.

In the presence of rigid body motion and when k-space data are obtained with multi-shot DTI sequences, diffusion tensors can only be reconstructed with non-linear methods. The benefit that one would get over the conventional linear tensor estimation method by using non-linear methods certainly depends on the amount of rigid body motion present. The benefit of using the proposed NLCG method increases for larger motion. For smaller degrees of motion, however, the error in eigenvector orientation and FA is mostly dominated by the noise inherent in DTI raw data. Thus, the error resulting from the change in diffusion encoding direction is less important for smaller positional changes. However, our single step non-linear method proposed in this study can still be quite effective in correcting for smaller motion in studies that use a large number of diffusion encoding gradients and that have high SNR. Despite the fact that the range of motion evaluated in this study was above average for adult clinical studies, such considerable positional changes happen quite frequently in DTI studies of unsedated, small infants and in fetal imaging.

Due to the direct computation of the tensor information and the more complex cost function, the reconstruction time becomes longer than with regular augmented iterative SENSE. Essentially, for each iteration, a forward and inverse gridding over $n_c \times n_\delta \times n_g$ interleaves must be carried out. In addition to the linear CG, NLCG requires minimization along one dimension after the search direction is determined. This causes NLCG to contain 2 nested iterations, which takes more time. In particular, for $n_c=8$, $n_\delta=26$ and $n_g=8$, method C takes ~1 hr with 15 iterations per diffusion weighted image and method D takes ~4 hours with 12 outer and 4 inner iterations. Nevertheless, it is possible to provide a major speed-up by a factor of 50% using the transfer function approach to replace the forward and inverse gridding steps by a convolution operation. Moreover, the entire algorithm can be run in multiple threads on a parallel CPU architecture which can provide further speed-up.

Since the algorithm proposed herein solves for the tensor maps within a single step, one has more control over the optimization procedure. For example, regularization of the reconstruction problem is straightforward and can be performed by adding extra terms to the cost function (Eq. [6]). This regularization can be either a total variation based constraint or an edge preserving function.

5. CONCLUSIONS

Despite co-registering individual diffusion-weighted images, the accuracy of computed tensor information (e.g. orientation of eigenvectors, FA) can be significantly impaired due to falsely assumed diffusion-encoding directions following motion correction. Particularly, for multi-shot methods, such as diffusion-weighted PROPELLER FSE and EPI or multi-shot spiral and EPI, k-space data can be generated with inconsistent diffusion-encoding leading to ambiguous tensor information. In this study, a new reconstruction method has been proposed that estimates maps of the diffusion tensor elements in a single step. Its efficacy in simultaneously correcting for both microscopic and macroscopic motion was demonstrated in phantom and in-vivo experiments. The presented generalized mathematical framework can be applied to any trajectory and can be used in conjunction with parallel imaging. Although the degree of improvement depends, of course, on the severity and pattern of motion, our initial experimental data demonstrate that a considerable improvement in the accuracy of the observed tensor information can be achieved using this approach.

The invention claimed is:

1. A method of correcting for object motion during tensor magnetic resonance imaging (MRI), the method comprising:
   acquiring a set of k-space MRI data points by acquiring one or more k-space subsets of MRI data points;
   determining an object orientation corresponding to each of said k-space subsets;
   providing a k-space tensor model including said object orientation for each of said k-space subsets as inputs;
   reconstructing a tensor MRI image from said set of k-space MRI data points by utilizing said k-space tensor model to account for object orientation.

2. The method of claim 1, wherein said tensor MRI image is a diffusion tensor MRI scan.

3. The method of claim 1, wherein said tensor MRI image is a phase contrast MRI scan.

4. The method of claim 1, wherein said k-space tensor model comprises a model selected from the group consisting of: vectors, 2-dimensional tensors, and higher-order tensors.

5. The method of claim 1, wherein said reconstructing a tensor MRI image further comprises providing a correction for motion-induced phase errors during diffusion-encoding of said k-space subsets.

6. The method of claim 1, wherein said reconstructing a tensor MRI image further comprises providing simultaneous correction for coil sensitivity, off-resonance, and gradient non-linearities.

7. The method of claim 1, further comprising employing parallel imaging in order to compensate for k-space undersampling, or to accelerate overall data acquisition, or to increase k-space data support for diffusion phase correction.

8. The method of claim 1, wherein said reconstructing comprises using a non-linear conjugate gradient method to numerically determine said tensor MRI image.

9. The method of claim 1, wherein one or more of said k-space subsets have corresponding object orientations that would impair k-space data consistency and/or impair tensor encoding.

10. The method of claim 9, wherein two or more of said corresponding object orientations are different from each other.

11. The method of claim 1, wherein none of said k-space subsets individually provides sufficient information for a complete image reconstruction.

12. The method of claim 1, wherein said object orientation corresponding to each of said k-space subsets is determined by image-space tracking of said object during or after acquisition of said k-space subsets.

13. The method of claim 12, wherein said image-space tracking of said object is performed prospectively or retrospectively.

14. The method of claim 12, wherein said image space tracking of said object is performed with an external tracking method or with an MRI-intrinsic tracking method.

15. The method of claim 1, further comprising:
determining an object spatial transformation corresponding to each of said k-space subsets;
including said object spatial transformation for each of said k-space subsets as inputs for said k-space tensor model.

16. A method of correcting for object motion during tensor magnetic resonance imaging (MRI), the method comprising:
acquiring a set of k-space MRI data points by acquiring one or more k-space subsets of MRI data points;
determining an object spatial transformation corresponding to each of said k-space subsets;
providing a k-space tensor model including said object spatial transformation for each of said k-space subsets as inputs;
reconstructing a tensor MRI image from said set of k-space MRI data points by utilizing said k-space tensor model to account for object spatial transformation.

* * * * *